United States Patent
Chong et al.

(10) Patent No.: US 11,562,987 B2
(45) Date of Patent: Jan. 24, 2023

(54) SEMICONDUCTOR DEVICES WITH MULTIPLE SUBSTRATES AND DIE STACKS

(71) Applicant: Micron Technology, Inc., Boise, ID (US)

(72) Inventors: Chin Hui Chong, Singapore (SG); Hong Wan Ng, Singapore (SG); Hem P. Takiar, Fremont, CA (US); Seng Kim Ye, Singapore (SG); Kelvin Tan Aik Boo, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/232,333

(22) Filed: Apr. 16, 2021

(65) Prior Publication Data
US 2022/0336417 A1    Oct. 20, 2022

(51) Int. Cl.
*H01L 25/065*    (2006.01)
*H01L 23/498*    (2006.01)
(Continued)

(52) U.S. Cl.
CPC ...... *H01L 25/0657* (2013.01); *H01L 23/3128* (2013.01); *H01L 23/49816* (2013.01);
(Continued)

(58) Field of Classification Search
CPC ................. H01L 25/0652; H01L 2225/06555
See application file for complete search history.

(56) References Cited

U.S. PATENT DOCUMENTS

2005/0212114 A1    9/2005    Kawano et al.
2012/0292745 A1    11/2012   Park et al.
(Continued)

FOREIGN PATENT DOCUMENTS

| CN | 102790042 A | 11/2012 |
| TW | 201822284 A | 6/2018 |
| TW | 201834189 A | 9/2018 |

OTHER PUBLICATIONS

TW Patent Application No. 110129080—Taiwanese Office Action and Search Report, dated Mar. 17, 2022, with English Translation, 13 pages.
(Continued)

*Primary Examiner* — Yu-Hsi D Sun
(74) *Attorney, Agent, or Firm* — Perkins Coie LLP

(57) ABSTRACT

Semiconductor devices having multiple substrates and die stacks, and associated systems and methods, are disclosed herein. In some embodiments, a semiconductor device includes a package substrate, and a first die stack mounted on the package substrate and including a plurality of first memory dies. The device can include a substrate mounted on the first die stack, the substrate including a plurality of routing elements. The device can also include a second die stack mounted on the substrate, the second die stack including a plurality of second memory dies. The device can further include a controller die mounted on the substrate. The controller die can be configured to communicate with the second die stack via the routing elements of the substrate. The device can include a mold material encapsulating the first die stack, the second die stack, the substrate, and the controller die.

20 Claims, 5 Drawing Sheets

(51) Int. Cl.
*H01L 23/538* (2006.01)
*H01L 23/00* (2006.01)
*H01L 25/00* (2006.01)
*H01L 23/31* (2006.01)

(52) U.S. Cl.
CPC .. *H01L 23/49822* (2013.01); *H01L 23/49833* (2013.01); *H01L 23/49838* (2013.01); *H01L 23/5385* (2013.01); *H01L 23/5386* (2013.01); *H01L 24/48* (2013.01); *H01L 24/49* (2013.01); *H01L 25/50* (2013.01); *H01L 2224/48091* (2013.01); *H01L 2224/48147* (2013.01); *H01L 2224/48225* (2013.01); *H01L 2224/49107* (2013.01); *H01L 2225/0651* (2013.01); *H01L 2225/06506* (2013.01); *H01L 2225/06517* (2013.01); *H01L 2225/06562* (2013.01); *H01L 2225/06568* (2013.01); *H01L 2924/1431* (2013.01); *H01L 2924/1436* (2013.01); *H01L 2924/1438* (2013.01)

(56) References Cited

U.S. PATENT DOCUMENTS

| | | |
|---|---|---|
| 2013/0161788 A1* | 6/2013 | Chun .................. H01L 25/0652 257/532 |
| 2013/0175701 A1 | 7/2013 | Park et al. |
| 2015/0303132 A1 | 10/2015 | Michael et al. |
| 2017/0243858 A1 | 8/2017 | Chou et al. |
| 2017/0358564 A1* | 12/2017 | Lee ........................ H01L 25/18 |
| 2018/0158768 A1 | 6/2018 | Kim et al. |
| 2021/0104494 A1 | 4/2021 | Vodrahalli et al. |
| 2021/0233891 A1* | 7/2021 | Jung ........................ H01L 25/03 |

OTHER PUBLICATIONS

U.S. Appl. No. 17/100,610—Unpublished U.S. Patent Application to Fay et al., filed Nov. 20, 2020, 28 pages.

* cited by examiner

SEMICONDUCTOR DEVICES WITH MULTIPLE SUBSTRATES AND DIE STACKS

TECHNICAL FIELD

The present technology generally relates to semiconductor devices, and more particularly relates to semiconductor devices with multiple substrates for signal routing for respective die stacks.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

Market pressures continually drive semiconductor manufacturers to reduce the size of die packages to fit within the space constraints of electronic devices, while also driving them to increase the functional capacity of each package to meet operating parameters. One approach for increasing the processing power of a semiconductor package without substantially increasing the surface area covered by the package (the package's "footprint") is to vertically stack multiple semiconductor dies on top of one another in a single package. The dies in such vertically-stacked packages can be electrically coupled to each other and/or to a substrate via wires, interconnects, or other conductive structures. However, conventional techniques for routing signals to and from vertically-stacked semiconductor dies may rely on complicated multilayered routing structures within a single package substrate, which may result in reduced signal integrity, larger package sizes, and increased manufacturing costs.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
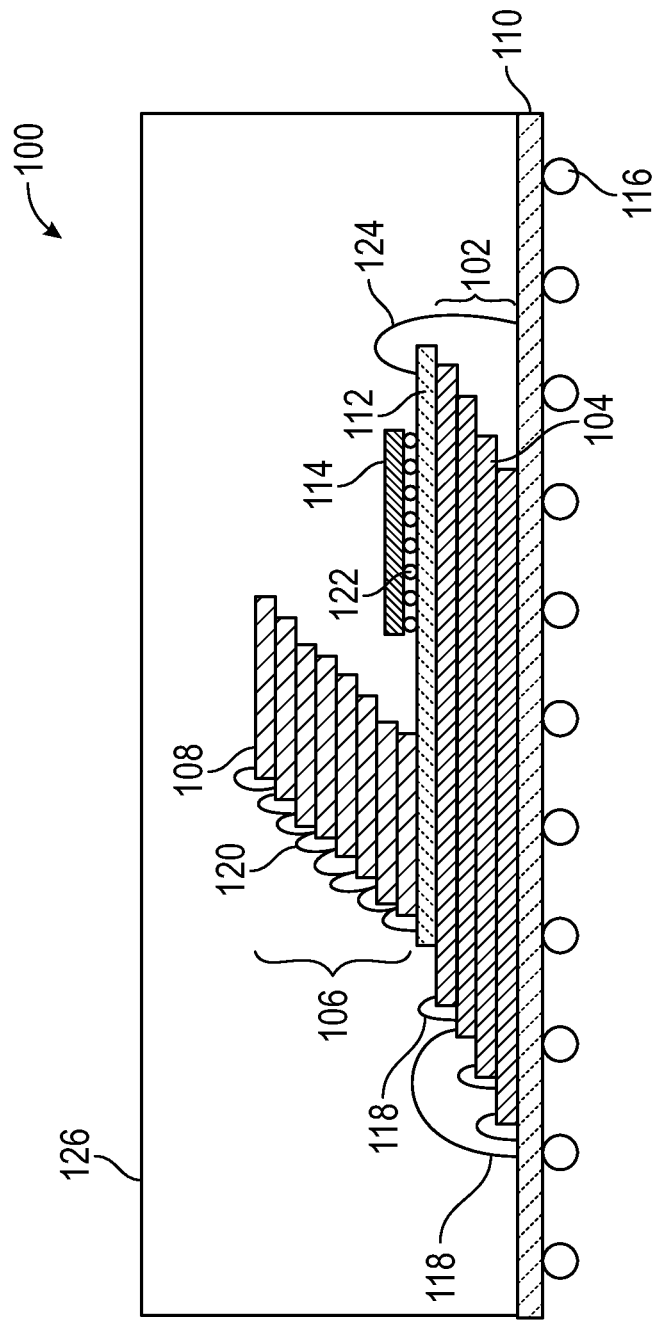
FIG. 1A is a partially schematic side cross-sectional view of a semiconductor device configured in accordance with embodiments of the present technology

Specific details of several embodiments of semiconductor devices, and associated systems and methods, are described below. In some embodiments, for example, a semiconductor device includes a first die stack including a plurality of first memory dies (e.g., DRAM dies), a second die stack including a plurality of second memory dies (e.g., NAND dies), and a controller and/or logic die for the second die stack (e.g., a NAND controller die). The first die stack can be mounted on a package substrate. The semiconductor device can also include an intermediate substrate mounted on the first die stack, and the second die stack and controller die can be mounted on the intermediate substrate. The semiconductor device can further include a mold material encapsulating the first die stack, second die stack, intermediate substrate, and controller die to form a single, unitary package.

In some embodiments, the signal routing for the second die stack is physically separated and/or electrically isolated from the signal routing for the first die stack. For example, the second die stack can communicate with the controller die via routing elements in the intermediate substrate, while the first die stack can communicate with an external device (e.g., a host device) via routing elements in the packaging substrate. Accordingly, the signal routing in the package substrate can be reduced and/or simplified, e.g., compared to conventional devices that route all signals through the package substrate. As a result, thinner and less complex package substrates can be used, which can reduce the overall package height. This approach can also improve signal integrity by reducing or eliminating crosstalk that may arise with routing all die stack signals through a single substrate. Additionally, the signal routing in the intermediate substrate can be modified independently of the signal routing in the package substrate, which can reduce manufacturing costs and provide greater flexibility in device design.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using semiconductor manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 1A-5. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1A is a partially schematic side cross-sectional view of a semiconductor device 100 ("device 100") configured in accordance with embodiments of the present technology. The device 100 includes a first die stack 102 including a plurality of first dies 104, and a second die stack 106 including a plurality of second dies 108. The device 100 also includes a first substrate 110 (e.g., a package substrate) supporting the first die stack 102, and a second substrate 112 (e.g., an intermediate substrate) supporting the second die stack 106. The first die stack 102 can be mounted on the first substrate 110, the second substrate 112 can be mounted on the first die stack 102, and the second die stack 106 can be mounted on the second substrate 112. The device 100 can also include a third die 114 mounted on the second substrate 112. The third die 114 can be a controller and/or logic die (e.g., a microcontroller) that is configured to control the operations of the second die stack 106, as discussed in greater detail below.

Each of the first, second, and third dies 104, 108, 114 can include a semiconductor substrate (e.g., a silicon substrate, a gallium arsenide substrate, an organic laminate substrate, etc.). In some embodiments, the first, second, and third dies 104, 108, 114 each include a front and/or active surface having various types of semiconductor components. For example, any of the first, second, or third dies 104, 108, 114 can include memory circuits (e.g., dynamic random-access memory (DRAM), static random-access memory (SRAM), flash memory (e.g., NAND, NOR), or other type of memory circuits), controller circuits (e.g., DRAM controller circuits), logic circuits, processing circuits, circuit elements (e.g., wires, traces, interconnects, transistors, etc.), imaging components, and/or other semiconductor features. Optionally, one or more of the first or second dies 104, 108 can be a "blank" substrate that does not include semiconductor components and that is formed from, for example, crystalline, semi-crystalline, and/or ceramic substrate materials, such as silicon, polysilicon, aluminum oxide ($Al_2O_3$), sapphire, and/or other suitable materials.

In such embodiments, the device 100 is a memory device, and some or all of the first and second dies 104, 108 are memory dies (e.g., NAND dies, DRAM dies, SRAM dies, etc.). The first and second dies 104, 108 can each be the same type of memory die. Alternatively, the device 100 can be a mixed memory device, with some or all of the first dies 104 being a different memory die type than some or all of the second dies 108. For example, the first dies 104 can each be a first memory die type (e.g., DRAM) and the second dies 108 can each be a second memory die type (e.g., NAND). Optionally, the third die 114 can be a memory controller for the second dies 108 (e.g., a NAND memory controller). In other embodiments, however, the first, second, and/or third dies 104, 108, 114 can include other types of semiconductor dies.

In the illustrated embodiment, the first dies 104 of the first die stack 102 and the second dies 108 of the second die stack 106 are each arranged in a shingled or stepped configuration in which each die is offset horizontally from the die below to allow for electrical interconnections, as discussed in greater detail below. Although FIG. 1A depicts the first die stack 102 as including four first dies 104, and the second die stack 106 as including eight second dies 108, in other embodiments, the first and/or second die stacks 102, 106 can each independently have fewer or more dies (e.g., one, two, four, five, six, seven, eight, nine, ten, or more dies). The first and/or second dies 104, 108 can be stacked in a "face-up" configuration with their front surfaces oriented upward and away from the package substrate 110 and intermediate substrate 112. The third die 114 can be oriented in a "face-down" configuration with its front surface oriented downward and toward the intermediate substrate 112. In other embodiments, however, one or more of the first and/or second dies 104, 108 can be in a face-down configuration, and/or the third die 114 can be in a face-up configuration.

The first substrate 110 can be or include any component suitable for supporting the first die stack 102, such as an interposer, a printed circuit board, a built-up redistribution layer (RDL), a dielectric spacer, another semiconductor die (e.g., a logic die), or another suitable package substrate. In some embodiments, the first substrate 110 includes additional semiconductor components (e.g., doped silicon wafers or gallium arsenide wafers), nonconductive components (e.g., various ceramic substrates, such as aluminum oxide ($Al_2O_3$), etc.), aluminum nitride, and/or conductive portions (e.g., interconnecting circuitry, TSVs, etc.). The first substrate 110 can be coupled to conductive elements or contacts 116 (e.g., solder balls, conductive bumps, conductive pillars, conductive epoxies, and/or other suitable electrically conductive elements) configured to electrically couple the device 100 to an external device (not shown), such as a host device as discussed further below.

Figure 1B:
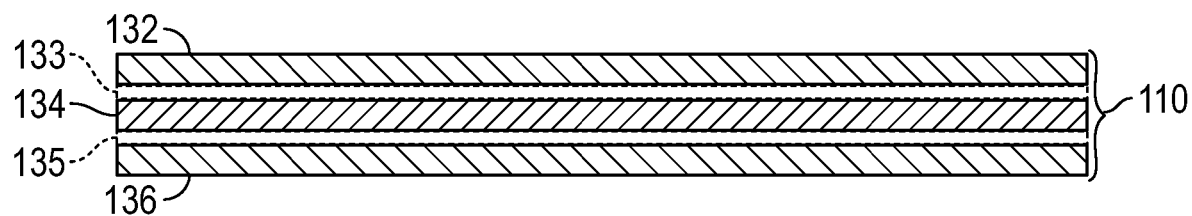
FIG. 1B is a partially schematic side cross-sectional view of a first substrate of the semiconductor device of FIG. 1A.

FIG. 1B is a partially schematic side cross-sectional view of the first substrate 110. The first substrate 110 can include a plurality of discrete layers. In the illustrated embodiment, for example, the first substrate 110 includes three functional and/or metal layers: a first signal routing layer 132, a power and/or ground shield layer 134, and a second signal routing layer 136. The power and/or ground shield layer 134 can be positioned between the first and second signal routing layers 132, 136. Additionally, the first substrate 110 can include additional layers of insulating material between the functional and/or metal layers, such as a first insulating layer 133 between the first signal routing layer 132 and the power and/or ground shield layer 134, and a second insulating layer 135 between the power and/or ground shield layer 134 and the second signal routing layer 136. In other embodiments, however, the number and/or arrangement of layers in the first substrate 110 can be varied as desired. Some or all of the layers 132-136 of the first substrate 110 can include routing elements (e.g., electrically conductive components such as traces, bond pads, vias, etc.—omitted for purposes of simplicity) for transmitting signals to and/or from various components of the device 100 (e.g., the first die stack 102), as described in greater detail below.

Referring again to FIG. 1A, the first die stack 102 can be electrically coupled to the first substrate 110 via a plurality of first electrical connectors 118. In the illustrated embodiment, the first electrical connectors 118 are depicted as a plurality of wirebonds connecting individual first dies 104 to each other and/or to the first substrate 110. Alternatively or in combination, the first electrical connectors 118 can include other types of connecting elements, such as silicon vias (TSVs), interconnect structures (e.g., bumps, microbumps, pillars, columns, studs, etc.), and/or any other die-to-die or die-to-substrate interconnection elements known to those of skill in the art.

In some embodiments, the first die stack 102 communicates with an external device (e.g., a host device—not shown in FIG. 1A) via signals routed through the first electrical connectors 118, first substrate 110, and the conductive elements 116. The first substrate 110 can include one or more routing elements (e.g., signal traces, bond pads, vias, etc., as previously described with reference to FIG. 1B) to transmit signals from the first die stack 102 and first electrical connectors 118 to the conductive elements 116, and vice-versa. For example, at least some of the first electrical connectors 118 can connect to bond pads on the first substrate 110 (not shown), and the routing elements of the first substrate 110 can connect each bond pad to a corresponding conductive element 116. The first substrate 110, conductive elements 116, and electrical connectors 118 can also transmit power from an external power source to the first die stack 102.

The second substrate 112 can be coupled to the first die stack 102 (e.g., to the uppermost first die 104 in the first die stack 102) via die attach film and/or other suitable techniques known to those of skill in the art. The second substrate 112 can be mounted directly onto the first die stack 102 without any intervening spacers, interposers, dies, or other support structures. The second substrate 112 can be any component suitable for supporting the second die stack 106, such as an interposer, a printed circuit board, a dielectric spacer, a built-up RDL, another semiconductor die (e.g., a logic die), or another suitable organic or inorganic substrate. The second substrate 112 can be made of the same or similar materials as the first substrate 110, or can be made of different materials. Optionally, the material of the second substrate 112 can be selected to reduce or minimize coefficient of thermal expansion (CTE) mismatch with the first substrate 110, e.g., to reduce thermomechanical stresses on the device 100 during manufacturing and/or operation.

Figure 1C:
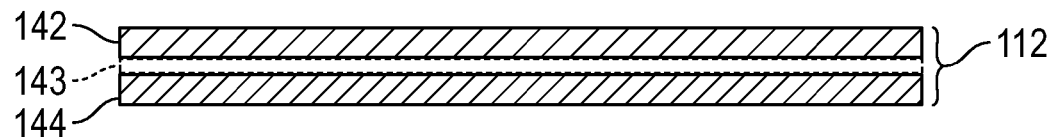
FIG. 1C is a partially schematic side cross-sectional view of a second substrate of the semiconductor device of FIG. 1A.

FIG. 1C is a partially schematic side cross-sectional view of the second substrate 112. The second substrate 112 can include a plurality of discrete layers. In the illustrated embodiment, for example, the second substrate 112 includes two functional and/or metal layers: a signal routing layer 142 and a power and/or ground shield layer 144. The power and/or ground shield layer 144 can be positioned below the signal routing layer 142. The second substrate 112 can further include an insulating layer 143 between the signal routing layer 142 and the power and/or ground shield layer 144. In other embodiments, however, the number and/or arrangement of layers in the second substrate 112 can be varied as desired. Some or all of the layers 142-144 of the second substrate 112 can include routing elements (e.g., traces, vias, bond pads, etc.—omitted for purposes of simplicity) for transmitting signals to and/or from various components of the device 100 (e.g., the second die stack 106 and/or the third die 114), as described in greater detail below.

Referring again to FIG. 1A, the second die stack 106 can be electrically coupled to the second substrate 112 via a plurality of second electrical connectors 120. The second electrical connectors 120 can be identical or generally similar to the first electrical connectors 118. In the illustrated embodiment, for example, the second electrical connectors 120 include a plurality of wirebonds connecting individual second dies 108 to each other and/or to the second substrate 112. In other embodiments, however, other types of die-to-die or die-to-substrate interconnection techniques can be used.

The third die 114 can be mounted on the second substrate 112 by a plurality of interconnect structures 122 (e.g., bumps, micro-bumps, pillars, columns, studs, etc.). In some embodiments, the third die 114 is attached to the second substrate 112 in a face-down configuration with the interconnect structures 122 electrically coupling the active surface of the third die 114 to the second substrate 112. The interconnect structures 122 can optionally be surrounded by an underfill material (omitted in FIG. 1A for purposes of simplicity). The location of the third die 114 on the second substrate 112 can provide more margin for introducing the underfill material around the interconnect structures 122 during the manufacturing process, e.g., compared to devices in which the third die 114 is located on the same substrate as the first die stack 102. In other embodiments, however, the third die 114 can be mounted in a face-up configuration (e.g., using die attach film) and can be electrically coupled to the second substrate 112 via wirebonds or other electrical connectors. As shown in FIG. 1A, the device 100 may not include any intervening spacers, supports, other dies, etc., between the third die 114 and the second substrate 112.

The second substrate 112 can include one or more routing elements (e.g., signal traces, bond pads, vias, etc., as previously described with reference to FIG. 1C) to communicate signals between the second die stack 106 and the third die 114. For example, at least some of the second electrical connectors 120 and interconnect structures 122 can connect to respective bond pads on the second substrate 112 (not shown), and the routing elements of the second substrate 112 can connect individual bond pads to each other. Accordingly, the third die 114 can communicate with the second die stack 106 via the second substrate 112, e.g., to control the operation of the second dies 108.

The second substrate 112 can be electrically coupled to the first substrate 110 by at least one third electrical connector 124 (e.g., one or more wirebonds). The third electrical connector(s) 124 can route signals from the second die stack 106 and/or third die 114 to the first substrate 110, which in turn can route the signals to an external device (e.g., via the routing elements of the first substrate 110 and the conductive elements 116). Conversely, signals from the external device can be transmitted to the second die stack 106 and/or third die 114 via the conductive elements 116, first substrate 110, third electrical connector(s) 124, and second substrate 112. The conductive elements 116, first substrate 110, third electrical connector(s) 124, and second substrate 112 can also transmit power from an external power source to the second die stack 106 and/or the third die 114. Optionally, the first die stack 102 can communicate with the second die stack 106 and/or the third die 114 via signals routed through the first substrate 110, third electrical connector(s) 124, and second substrate 112.

In some embodiments, the second substrate 112 includes most or all of the signal routing pathways for communication between the second die stack 106 and third die 114, and/or the first substrate 110 includes few or no signal routing pathways for communication between the second die stack 106 and third die 114. Similarly, in some embodiments, the first substrate 110 includes most or all of the signal routing pathways for communication between the first die stack 102 and the external device, and/or the second substrate 112 includes few or no signal routing pathways for communication between the first die stack 102 and the external device. Accordingly, the first die stack 102 and second die stack 106 can be electrically isolated from each other in that their respective signal routing pathways are decoupled from each other and distributed across different substrates.

Optionally, the first substrate 110 and/or the second substrate 112 can include signal routing pathways for communication between the external device and the third die 114, and/or communication between the external device and the second die stack 106. These signal routing pathways can be different and/or separate from (e.g., electrically isolated from) the signal routing pathways for communication between the external device and the first die stack 102. For example, the first substrate 110 can include a plurality of external contacts for communicating with the external device (e.g., which can be or include the conductive elements 116), the first die stack 102 can be electrically coupled to a first subset of the external contacts, and the second die stack 106 and/or third die 114 can be electrically coupled to a second, different subset of the external contacts. In some embodiments, the third die 114 is electrically interposed between the second die stack 106, and the second substrate 112 and/or external device. In such embodiments, the second die stack 106 does not directly communicate with the second substrate 112 and/or external device, and instead communicates indirectly with the second substrate 112 and/or external device via signals routed through the third die 114.

The electrical isolation between the first and second die stacks 102, 106 can provide various advantages. For example, the electrical isolation can reduce crosstalk and/or other interference that may otherwise occur if the signal routing pathways for the first and second die stacks 102, 106 were located in the same substrate. Additionally, by separating the signal routing pathways across two different substrates, the amount and/or complexity of the routing in each substrate can be reduced. For example, the number of routing layers within each substrate can be reduced, which can reduce the overall size (e.g., height) of the device 100. In some embodiments, the first substrate 110 and/or second substrate 112 each independently have no more than six layers, five layers, four layers, three layers, or two layers.

Moreover, because the signal routing pathways for the first and second die stacks 102, 106 are located in different substrates, the routing in each substrate can be independently modified (e.g., based on the desired arrangement and/or functionality of the corresponding die stack) without little or no effect on the routing in the other substrate. Accordingly, the same or similar configuration of the first substrate 110 and first die stack 102 can be used with many different configurations of the second substrate 112, second die stack 106, and third die 114; and vice-versa. This modularized approach can improve design and manufacturing flexibility, and reduce costs.

As shown in FIG. 1A, the device 100 can further include a mold material 126 encapsulating the first substrate 110, first die stack 102, second substrate 112, second die stack 106, and/or third die 114. The mold material 140 can be a resin, epoxy resin, silicone-based material, polyimide, or any other material suitable for protecting the various components of the device 100 from contaminants and/or physical damage. In some embodiments, the first substrate 110, first die stack 102, second substrate 112, second die stack 106, and/or third die 114 are all encapsulated by a continuous volume of mold material 140, e.g., in contrast to package-on-package (POP) configurations in which device components are encapsulated separately and then assembled into a single package.

Optionally, the device 100 can include surface-mounted components (not shown in FIG. 1A) such as capacitors, resistors, inductors, and/or other circuit elements. The surface-mounted components can be on the first substrate 110, the second substrate 112, or a combination thereof. The use of multiple substrates can provide greater space and flexibility for positioning surface-mounted components. In some embodiments, the semiconductor device 100 includes other components such as external heatsinks, a casing (e.g., thermally conductive casing), electromagnetic interference (EMI) shielding components, etc.

As described above, in some embodiments, the device 100 is a memory device and is configured to connect to a host device that utilizes memory for the temporary or persistent storage of information, or a component thereof. The host device can be a computing device such as a desktop or portable computer, a server, a hand-held device (e.g., a mobile phone, a tablet, a digital reader, a digital media player), or some component thereof (e.g., a central processing unit, a co-processor, a dedicated memory controller, etc.). The host device can be a networking device (e.g., a switch, a router, etc.), a recorder of digital images, audio and/or video, a vehicle, an appliance, a toy, or any one of a number of other products. In some embodiments, the host device is connected directly to the device 100, while in other embodiments, the host device can be indirectly connected to the device 100 (e.g., over a networked connection or through intermediary devices).

Figure 2:
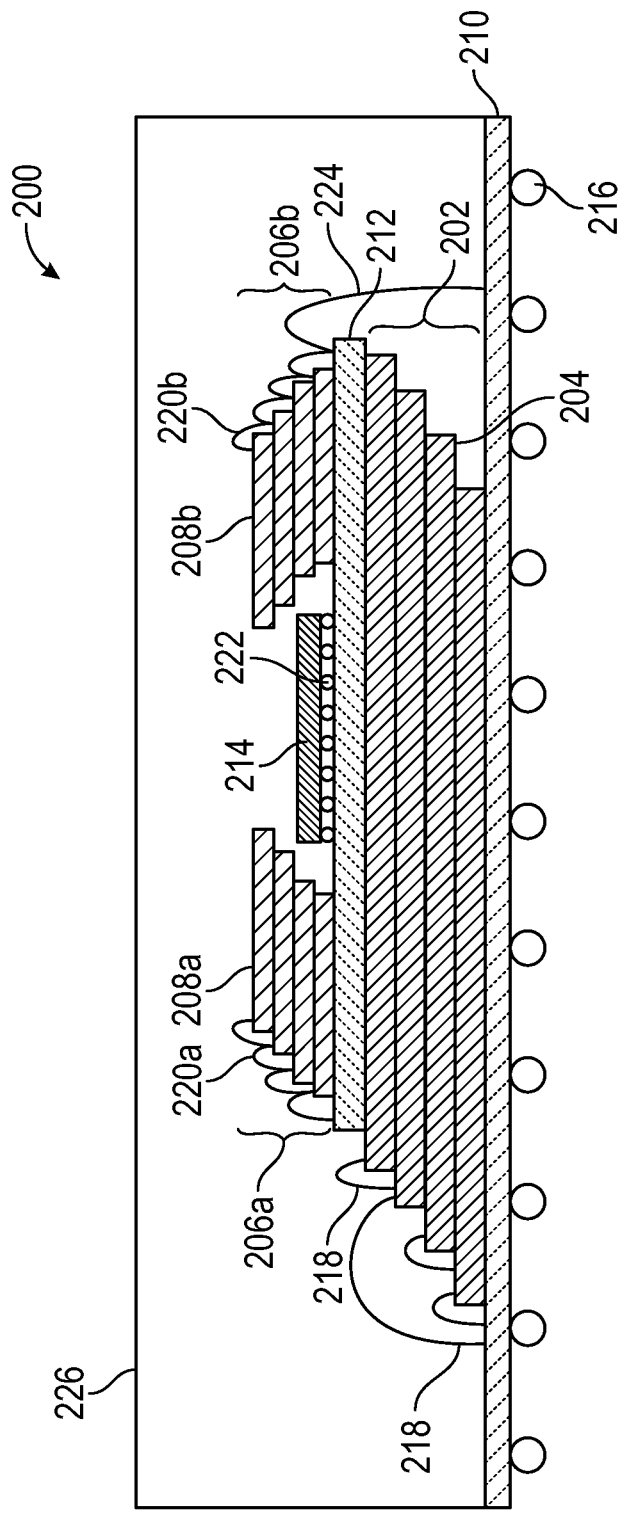
FIG. 2 is a partially schematic cross-sectional view of another semiconductor device configured in accordance with embodiments of the present technology.
Figure 3:
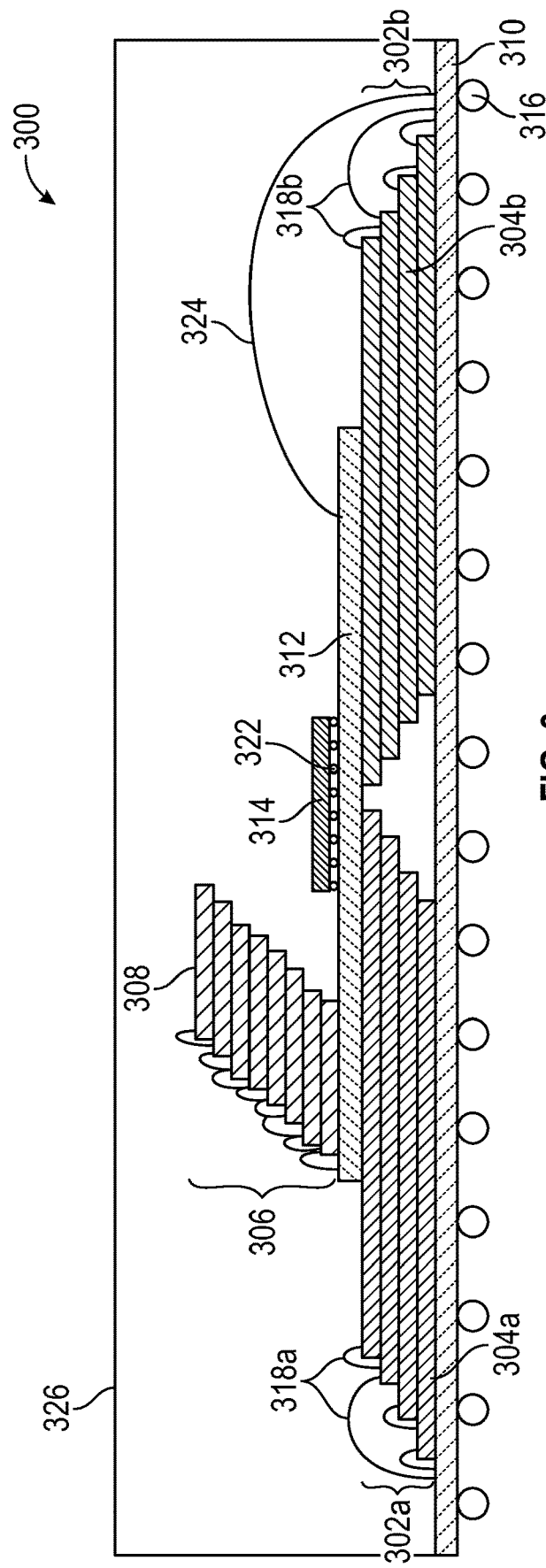
FIG. 3 is a partially schematic cross-sectional view of another semiconductor device configured in accordance with embodiments of the present technology.

FIGS. 2 and 3 illustrate semiconductor devices with various die stack configurations in accordance with embodiments of the present technology. The devices shown in FIGS. 2 and 3 can be generally similar to the device 100 described with respect to FIGS. 1A-1C. Accordingly, like numbers are used to identify similar or identical components, and the description of the devices shown in FIGS. 2 and 3 will be limited to those features that differ from the device 100 of FIGS. 1A-1C.

FIG. 2 is a partially schematic cross-sectional view of a semiconductor device 200 ("device 200") configured in accordance with embodiments of the present technology. The device 200 can be generally similar to the device 100 of FIGS. 1A-1C, except that the device 200 includes multiple die stacks (e.g., second die stack 206a and third die stack 206b) mounted on the second substrate 212. Although the illustrated embodiment shows two die stacks 206a-b on the second substrate 212, in other embodiments, the device 200 can include a greater number of die stacks on the second substrate 212, such as three, four, five, or more die stacks. The configuration of the device 200 can be advantageous for reducing overall package height while accommodating more dies.

The second die stack 206a can include a set of second dies 208a, and the third die stack 206b can include a set of third dies 208b. The second dies 208a can all be the same die type as the third dies 208b, or some or all of the second dies 208a can be different die types than some or all of the third dies 208b. In some embodiments, the second and third dies 208a-b can be memory dies (e.g., NAND dies). The second die stack 206a can include the same number of dies as the third die stack 206b, or the second die stack 206a can include a different number of dies than the third die stack 206b. Although FIG. 2 illustrates the second and third die stacks 206a-b as each having four dies, in other embodiments, the second and third die stacks 206a-b can each independently have a different number of dies (e.g., one, two, three, five, six, seven, eight, or more dies).

The device 200 can further include a fourth die 214, which can be identical or similar to the third die 114 of FIG. 1A. For example, the fourth die 214 can be a controller and/or logic die (e.g., a memory controller die) configured to control the operation of the second die stack 206a and/or the third die stack 206b. In the illustrated embodiment, the fourth die 214 is positioned on the second substrate 212 between the second die stack 206a and the third die stack 206b. In other embodiments, however, the fourth die 214 can be at a different location on the second substrate 212 (e.g., to location laterally spaced apart from the second and/or third die stacks 206a-b).

The second and third die stacks 206a-b can be electrically coupled to the second substrate 212 via second electrical connectors 220a (e.g., second wirebonds) and third electrical connectors 220b (e.g., third wirebonds), respectively. Accordingly, the fourth die 214 can communicate with the second and third die stacks 206a-b via routing elements in the second substrate 212. Optionally, the second and third die stacks 206a-b can also communicate with each other via the routing elements of the second substrate 212. In some embodiments, the second substrate 212 includes most or all of the signal routing pathways for communication between the second and third die stacks 206a-b and/or the fourth die 214, and/or the first substrate 210 includes few or no signal routing pathways for communication between the second and third die stacks 206a-b and/or the fourth die 214.

The second substrate 212 can be electrically coupled to the first substrate 210 by at least one fourth electrical connector 224 (e.g., one or more fourth wirebonds). The fourth electrical connector(s) 224 can route signals from the second die stack 206a, third die stack 206b, and/or fourth die 214 to the first substrate 210, which in turn can route the signals to an external device (e.g., via the routing elements of the first substrate 210 and the conductive elements 216). Conversely, signals from the external device can be transmitted to the second die stack 206a, third die stack 206b, and/or fourth die 214 via the conductive elements 216, first substrate 210, fourth electrical connector(s) 224, and second substrate 212. The conductive elements 216, first substrate 210, fourth electrical connector(s) 224, and second substrate 212 can also transmit power from an external power source to the second die stack 206a, third die stack 206b, and/or fourth die 214. Optionally, the first die stack 202 can communicate with the second die stack 206a, third die stack 206b, and/or fourth die 214 via signals routed through the first substrate 210, fourth electrical connector(s) 224, and second substrate 212.

FIG. 3 is a partially schematic cross-sectional view of a semiconductor device 300 ("device 300") configured in accordance with embodiments of the present technology. The device 300 can be generally similar to the device 100 of FIGS. 1A-1C, except that the device 300 includes multiple die stacks (e.g., first die stack 302a and third die stack 302b) mounted on the first substrate 310. Although the illustrated embodiment shows two die stacks 302a-b on the first substrate 310, in other embodiments, the device 300 can include a greater number of die stacks on the first substrate 310, such as three, four, five or more die stacks. The configuration of the device 300 can be advantageous for reducing overall package height while accommodating more dies.

The first die stack 302a can include a set of first dies 304a, and the third die stack 302b can include a set of third dies 304b. The first dies 304a can be the same die type as the third dies 304b, or some or all of the first dies 304a can be different die types than some or all of the third dies 304b. In some embodiments, some or all of the first and third dies 304a-b are memory dies (e.g., DRAM dies). The first die stack 302a can include the same number of dies as the third die stack 302b, or the first die stack 302a can include a different number of dies than the third die stack 302b. Although FIG. 3 illustrates the first and third die stacks 302a-b as each having four dies, in other embodiments, the first and third die stacks 302a-b can each independently have a different number of dies (e.g., one, two, three, five, six, seven, eight, or more dies).

In the illustrated embodiment, the second substrate 312 is mounted on and extends across both the first and third die stacks 302a-b. In other embodiments, however, the second substrate 312 can be mounted on only the first die stack 302a or only the third die stack 302b. As previously described with reference to FIGS. 1A-1C, the second substrate 312 can support a second die stack 306 and/or a fourth die 314 (which can be identical or similar to the third die 114 of FIG. 1A).

The first and third die stacks 302a-b can be electrically coupled to the first substrate 310 via first electrical connectors 318a (e.g., first wirebonds) and third electrical connectors 318b (e.g., third wirebonds), respectively. Accordingly, the first and third die stacks 302a-b can communicate with each other via routing elements in the first substrate 310. Optionally, the first and third die stacks 302a-b can communicate with an external device via the routing elements in the first substrate 310 and conductive elements 316. The first substrate 310 and conductive elements 316 can also transmit power from an external power source to the first and third die stacks 302a-b. In some embodiments, the first substrate 310 includes most or all of the signal routing pathways for communication between the first and third die stacks 302a-b, and/or the second substrate 312 includes few or no signal routing pathways for communication between the first and third die stacks 302a-b. Similarly, in some embodiments, the first substrate 310 includes most or all of the signal routing pathways for communication between the first and third die stacks 302a-b and an external device, and/or the second substrate 312 includes few or no signal routing pathways for communication between the first and third die stacks 302a-b and an external device.

Figure 4:
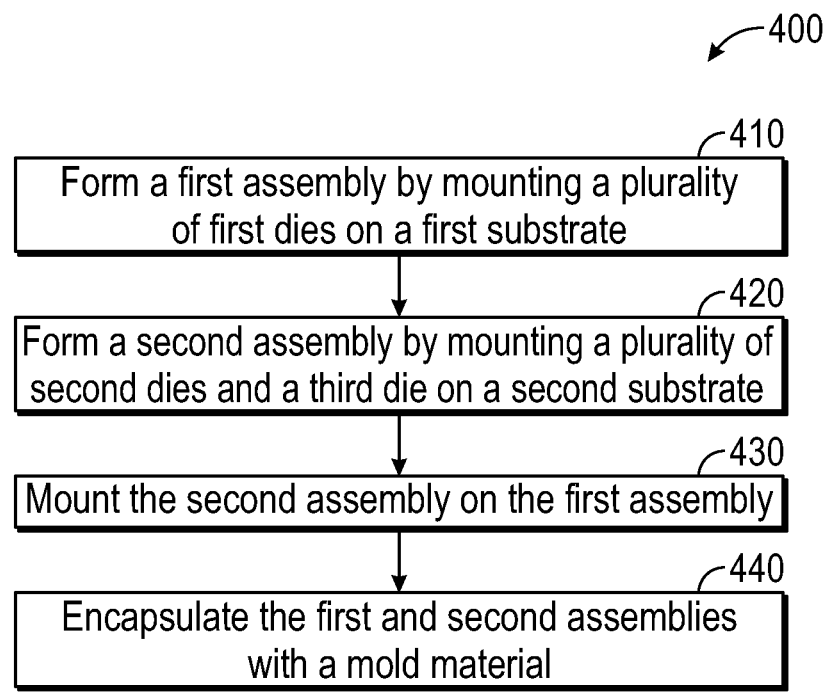
FIG. 4 is a flow diagram illustrating a method for manufacturing a semiconductor device in accordance with embodiments of the present technology.

FIG. 4 is a flow diagram illustrating a method 400 for manufacturing a semiconductor device in accordance with embodiments of the present technology. The method 400 can be used to fabricate any of the semiconductor devices described herein, such as any of the devices 100-300 of FIGS. 1A-3.

The method 400 begins at step 410 with forming a first assembly by mounting a plurality of first dies on a first substrate. The first dies (e.g., first dies 104 of FIG. 1A) can be mounted on the first substrate (e.g., first substrate 110 of FIG. 1A) in order to form a first die stack (e.g., first die stack 102), in accordance with techniques known to those of skill in the art. In some embodiments, the first assembly includes a plurality of first memory dies (e.g., DRAM dies) arranged in a vertical stack on a package substrate. Optionally, the first dies can be assembled into a plurality of die stacks on the first substrate, e.g., as previously described with reference to FIG. 3. Step 410 can also include electrically coupling the first dies to the first substrate via wirebonds or other electrical connectors. In other embodiments, the first dies can be electrically coupled to the first substrate in subsequent steps of the method 400 (e.g., during or after step 430 described below).

At step 420, the method 400 continues with forming a second assembly by mounting a plurality of second dies and a third die on a second substrate. The second dies (e.g., second dies 108 of FIG. 1A) can be mounted on the second substrate (e.g., second substrate 112 of FIG. 1A) in order to form a second die stack (e.g., second die stack 106), in accordance with techniques known to those of skill in the art. Optionally, the second dies can be assembled into a plurality of die stacks on the second substrate, e.g., as previously described with reference to FIG. 2. The third die (e.g., third die 114 of FIG. 1A) can be mounted on the second substrate before, during, or after mounting the second dies on the second substrate. In some embodiments, the second assembly includes a plurality of second memory dies (e.g., NAND dies) arranged in a vertical stack on an intermediate substrate, and a controller and/or logic die for the second memory dies on the intermediate substrate.

Optionally, step 410 can also electrically coupling the second dies to the second substrate (e.g., via wirebonds and/or other electrical connectors), and/or electrically coupling the third die to the second substrate (e.g., via interconnect structures). The third die can be electrically coupled to the second substrate before, during, or after electrically coupling the second dies to the second substrate. In other embodiments, the second dies and/or the third die can be electrically coupled to the second substrate in subsequent steps of the method 400 (e.g., during or after step 430 described below).

At step 430, the method 400 includes mounting the second assembly on the first assembly. The second assembly can be coupled to the first assembly using any technique known to those of skill in the art, such as a die attach film or other suitable adhesive materials. Optionally, step 430 can further include electrically coupling the second assembly to the first assembly, e.g., using wirebonds and/or other electrical connectors bridging the first and second substrates.

At step 440, the method 400 includes encapsulating the first and second assemblies with a mold material (e.g., mold material 126 of FIG. 1A), in accordance with techniques know to those of skill in the art. The first and second assemblies can be encapsulated in a single process step so that the final device is a unitary package with the same mold material surrounding both the first and second assemblies.

The method 400 can provide various advantages compared to conventional manufacturing processes. For example, because the first and second assemblies are fabricated in separate process steps, the first and second assemblies can be independently tested before assembling the final device. Accordingly, if one of the assemblies is malfunctioning or otherwise unsuitable for use, that individual assembly can be discarded and replaced, rather than discarding the entire device. This approach can reduce manufacturing costs and wasted parts.

Figure 5:
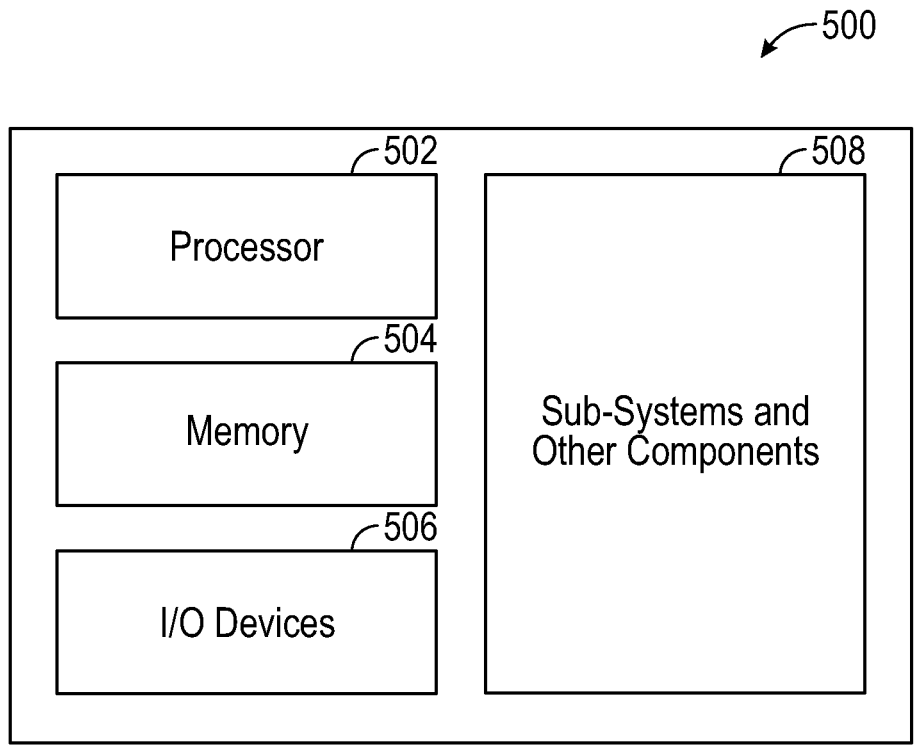
FIG. 5 is a schematic view of a system that includes a semiconductor device or package configured in accordance with embodiments of the present technology.

Any one of the semiconductor devices and/or packages having the features described above with reference to FIGS. 1A-4 can be incorporated into any of a myriad of larger and/or more complex systems, a representative example of which is system 500 shown schematically in FIG. 5. The system 500 can include a processor 502, a memory 504 (e.g., SRAM, DRAM, flash, and/or other memory devices), input/output devices 506, and/or other subsystems or components 508. The semiconductor dies and/or packages described above with reference to FIG. 1A-4 can be included in any of the elements shown in FIG. 5. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. With regard to these and other example, the system 500 can be housed in a single unit or distributed over multiple interconnected units, e.g., through a communication network. The components of the system 500 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

We claim:

1. A semiconductor device, comprising:
   a package substrate;
   a first die stack mounted on the package substrate, the first die stack including a plurality of first memory dies;
   an intermediate substrate mounted on the first die stack, the intermediate substrate including a plurality of routing elements;
   a second die stack mounted on the intermediate substrate, the second die stack including a plurality of second memory dies;
   a controller die mounted on the intermediate substrate, wherein the controller die is configured to communicate with the second die stack via the routing elements of the intermediate substrate; and
   a mold material encapsulating the first die stack, the second die stack, the intermediate substrate, and the controller die.

2. The semiconductor device of claim 1 wherein at least some of the first memory dies are a different memory die type than at least some of the second memory dies.

3. The semiconductor device of claim 2 wherein the first memory dies include a plurality of DRAM dies, and the second memory dies include a plurality of NAND dies.

4. The semiconductor device of claim 1 wherein the intermediate substrate is coupled directly to an uppermost first memory die of the first die stack.

5. The semiconductor device of claim 4 wherein the intermediate substrate is coupled to the uppermost first memory die via a die attach film.

6. The semiconductor device of claim 1 wherein:
   the package substrate includes a plurality of external package contacts,
   the first die stack is electrically coupled to a first subset of the external package contacts, and
   the second die stack and the controller die are electrically coupled to a second subset of the external package contacts.

7. The semiconductor device of claim 1 wherein the first die stack is electrically coupled to the package substrate via a plurality of first wirebonds, and the second die stack is electrically coupled to the intermediate substrate via a plurality of second wirebonds.

8. The semiconductor device of claim 7 further comprising at least one wirebond coupling the intermediate substrate to the package substrate.

9. The semiconductor device of claim 7 wherein the package substrate includes no more than three functional layers.

10. The semiconductor device of claim 1, further comprising a third die stack mounted on the intermediate substrate, the third die stack including a plurality of third memory dies, wherein the controller is configured to communicate with the third die stack via the routing elements of the substrate.

11. The semiconductor device of claim 1, further comprising a third die stack mounted on the package substrate, wherein the third die stack includes a plurality of third memory dies, and wherein the intermediate substrate is mounted on both the first and third die stacks.

12. The semiconductor device of claim 1 wherein the controller die is electrically interposed between the second die stack and the package substrate.

13. A semiconductor device, comprising:
a package substrate;
a first die stack mounted on the package substrate, the first die stack including a plurality of DRAM dies coupled to the package substrate;
an intermediate substrate mounted directly on the first die stack, the intermediate substrate including a plurality of routing elements, wherein the intermediate substrate is electrically coupled to the package substrate via one or more wirebonds;
a second die stack mounted on the intermediate substrate, the second die stack including a plurality of NAND dies coupled to the intermediate substrate;
a controller die mounted on the intermediate substrate, wherein the controller die is configured to communicate with the second die stack via the routing elements of the intermediate substrate; and
a mold material encapsulating the first die stack, the second die stack, the intermediate substrate, and the controller die.

14. The semiconductor device of claim 13, further comprising:
a plurality of first wirebonds electrically coupling the first die stack to the package substrate; and
a plurality of second wirebonds electrically coupling the second die stack to the intermediate substrate.

15. The semiconductor device of claim 13 wherein:
the package substrate includes a plurality of external package contacts,
the first die stack is electrically coupled to a first subset of the external package contacts, and
the second die stack and the controller die are electrically coupled to a second subset of the external package contacts.

16. The semiconductor device of claim 13 wherein the package substrate includes no more than three functional layers and the intermediate substrate includes no more than two functional layers.

17. The semiconductor device of claim 13 wherein the controller die is electrically interposed between the second die stack and the package substrate.

18. A method for manufacturing a semiconductor device, comprising:
forming a first assembly by mounting a plurality of first memory dies on a first substrate;
forming a second assembly by mounting a plurality of second memory dies and a controller die on a second substrate, wherein the second memory dies are electrically coupled to the controller die via routing elements in the second substrate;
mounting the second assembly on the first assembly; and
encapsulating, after mounting the second assembly on the first assembly, the first and second assemblies with a mold material.

19. The method of claim 18, further comprising:
electrically coupling the first memory dies to the first substrate via a plurality of first wirebonds;
electrically coupling the second memory dies to the second substrate via a plurality of second wirebonds; and
electrically coupling the second substrate to the first substrate via one or more third wirebonds.

20. The method of claim 18 wherein the first memory dies include a plurality of DRAM dies, and the second memory dies include a plurality of NAND dies.

* * * * *